United States Patent
Wu et al.

(10) Patent No.: US 8,223,501 B2
(45) Date of Patent: Jul. 17, 2012

(54) SERVER AND LOCKING DEVICE THEREOF

(75) Inventors: Chang-Ju Wu, Taipei Hsien (TW);
Yen-Chih Lien, Taipei Hsien (TW);
Hung-Ting Su, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 387 days.

(21) Appl. No.: 12/639,863

(22) Filed: Dec. 16, 2009

(65) Prior Publication Data

US 2011/0122588 A1    May 26, 2011

(30) Foreign Application Priority Data

Nov. 25, 2009 (CN) .......................... 2009 1 0310348

(51) Int. Cl.
*H05K 1/14* (2006.01)

(52) U.S. Cl. ........ 361/740; 361/741; 361/747; 361/759; 361/803; 361/801; 361/732

(58) Field of Classification Search .................. 361/740, 361/747, 759, 803, 801; 439/64, 92
See application file for complete search history.

(56) References Cited

U.S. PATENT DOCUMENTS

| | | | | | |
|---|---|---|---|---|---|
| 2,548,993 | A | * | 4/1951 | Mierzwa | 410/101 |
| 4,688,148 | A | * | 8/1987 | Mallory et al. | 361/740 |
| 6,362,978 | B1 | * | 3/2002 | Boe | 361/825 |
| 6,695,629 | B1 | * | 2/2004 | Mayer | 439/92 |
| 7,364,442 | B2 | * | 4/2008 | Bang et al. | 439/92 |
| 2007/0133187 | A1 | * | 6/2007 | Lin et al. | 361/799 |

* cited by examiner

*Primary Examiner* — Tuan T Dinh
*Assistant Examiner* — Steven Sawyer
(74) *Attorney, Agent, or Firm* — Altis Law Group, Inc.

(57) ABSTRACT

A server includes a substrate, a circuit board and a locking device assembling the circuit board to the substrate. The locking device includes a frame and a sliding member. The frame includes a pin having a main body and a hood wider than the main body. The sliding member defines a latching groove and a sliding groove therein. The latch groove includes a circular hole facing the sliding groove and a slit narrower than the circular hole. The sliding groove includes an opening facing the latch groove and a split. The opening is wider than the hood. The split is narrower than the hood but not narrower than the main body. The hood extends through the opening of the sliding groove. The sliding member moves relative to the frame along a first direction to cause the main body of the pin to engage in the split of the sliding groove.

14 Claims, 10 Drawing Sheets

SERVER AND LOCKING DEVICE THEREOF

BACKGROUND

1. Technical Field

The present disclosure relates generally to servers, and particularly to a server with a locking device for assembling a circuit board to the server.

2. Description of Related Art

Generally a plurality of circuit boards are arranged in a server. However, the circuit boards are assembled in the server using screws, which is inconvenient.

What is need, therefore, is a server having a locking device which can overcome the above limitations.

DETAILED DESCRIPTION

Figure 1:
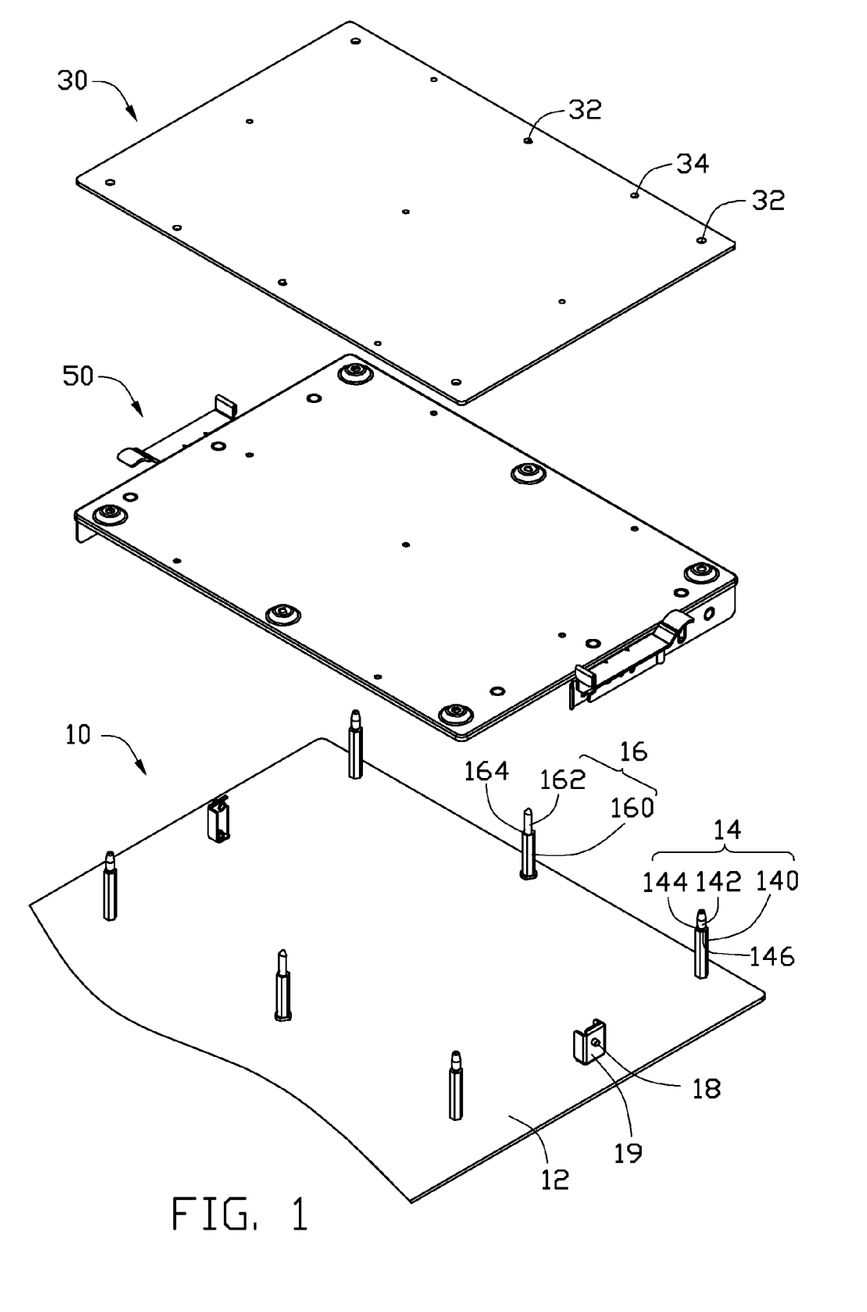
FIG. 1 is an isometric, exploded view of a server according to an exemplary embodiment.

Referring to FIG. 1, a server according to an exemplary embodiment includes a substrate 10, a circuit board 30, and a locking device 50 for assembling the circuit board 30 to the substrate 10. For simplification, the drawings show only one circuit board 30. It should be understood that the number of the circuit boards 30 can be changed according to need.

The substrate 10 is fixed in the server, and includes a main board 12, a plurality of fixing poles 14 extending outward from the main board 12, a plurality of positioning poles 16 extending outward from the main board 12, and a plurality of rods 18. In this embodiment, there are four fixing poles 14 and two positioning poles 16, and two rods 18 on the substrate 10.

The four fixing poles 14 are arranged corresponding to four corners of the circuit board 30, and define a rectangle. Each fixing pole 14 includes a post 140, a head 142, and a neck 144 between the post 140 and the head 142. The post 140 extends perpendicularly from the substrate 10, and is column-shaped. A diameter of the post 140 is larger than that of the neck 144 and the head 142, and the diameter of the head 142 is larger than that of the neck 144. A supporting face 146 is formed between the post 140 and the neck 144. A chamfer angle (not labeled) is formed at a tip end of the head 142 for facilitating assembly of the circuit board 30. A length of the head 142 is decided according to a thickness of the circuit board 30. In this embodiment, the length of the head 142 is slightly longer than a sum of the thickness of the circuit board 30 need to be mounted.

The positioning poles 16 are perpendicular to the substrate 10. Each positioning pole 16 is located at a middle of a longer side of the rectangle defined by the fixing poles 14. Each positioning pole 16 includes an upper portion 162 and a lower portion 160 larger than the upper portion 162 in diameter. A length of the lower portion 160 of the positioning pole 16 is substantially the same as that of the post 140 of the fixing pole 14. A bearing face 164 is defined between the upper portion 162 and the lower portion 160 of the positioning pole 16.

The rods 18 are respectively connected to the substrate 10 via flakes 19. Each rod 18 is located at a middle of a corresponding one of two shorter sides of the rectangle, and is arranged extending parallel to the longer side.

A through hole 32 is defined in the circuit board 30 corresponding to each of the fixing poles 14 and the positioning poles 16. A diameter of the through hole 32 corresponding the fixing pole 14 is larger than that of the head 142 of the fixing pole 14 but smaller than that of the post 140. A diameter of the through hole 32 corresponding to the positioning pole 16 is larger than that of the upper portion 162 of the positioning pole 16 but smaller than that of the lower portion 160. In addition, a plurality of bores 34 are defined in the circuit board 30 for assembling the circuit board 30 to the locking device 50.

Figure 2:
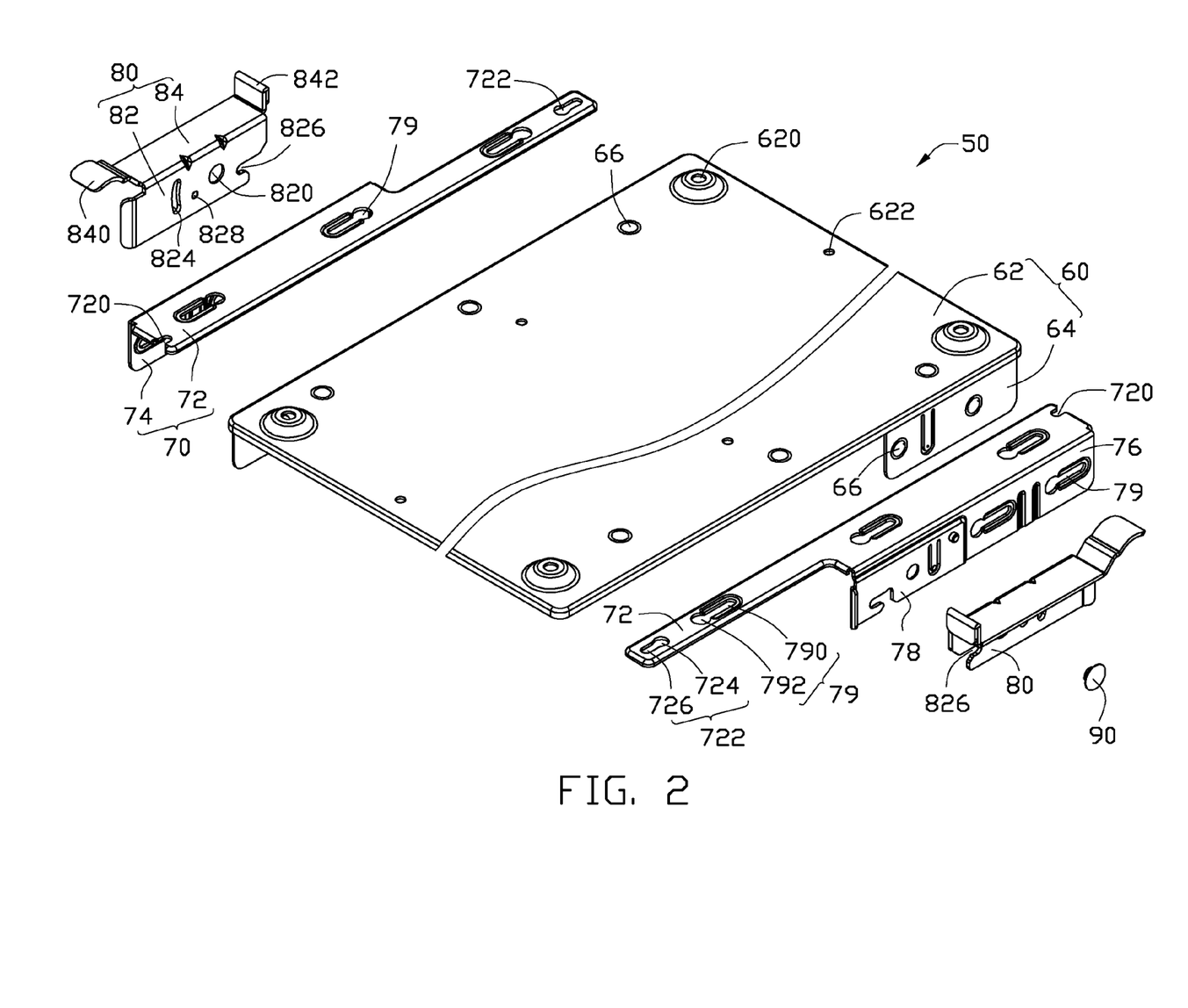
FIG. 2 is an exploded view of a locking device of the server of FIG. 1.
Figure 3:
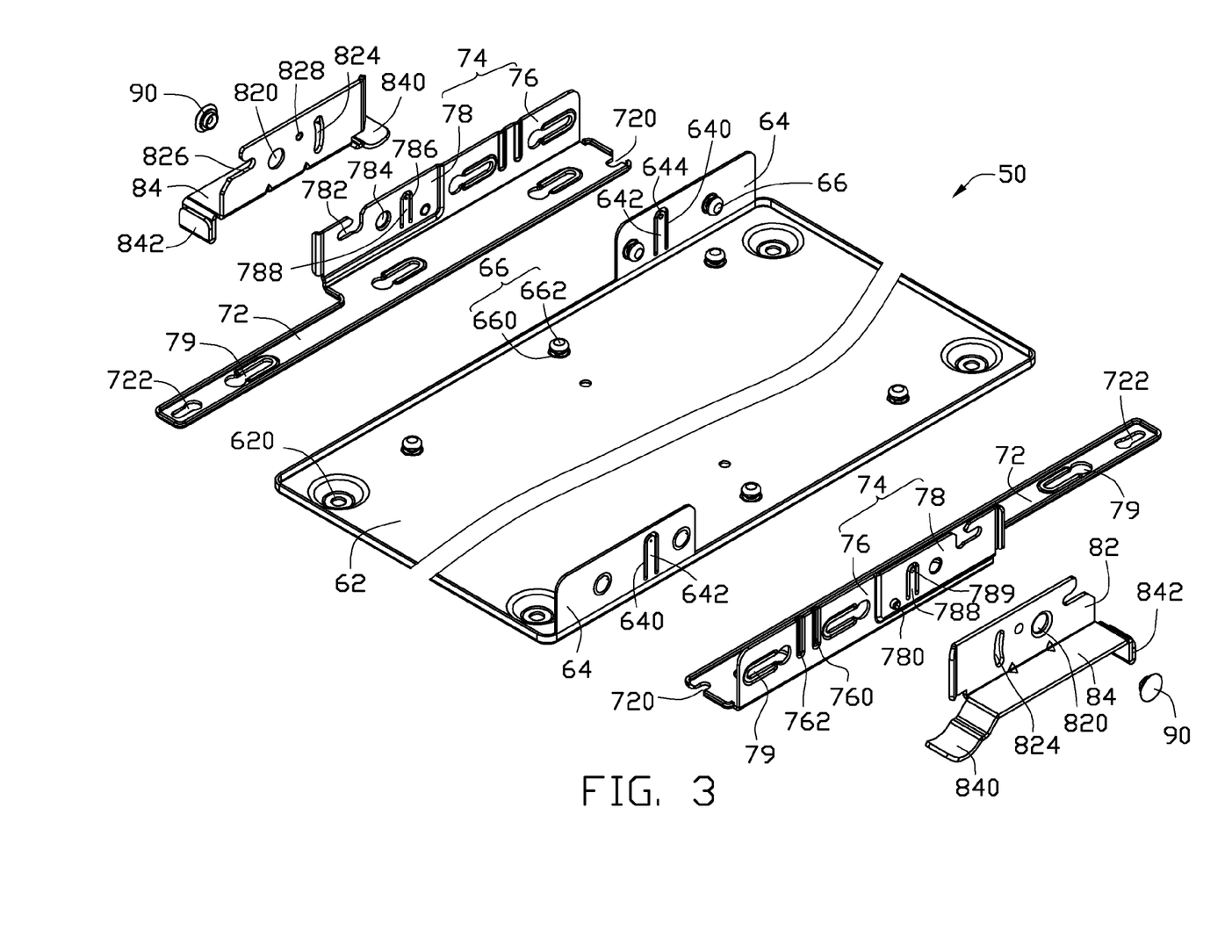
FIG. 3 is an inverted view of FIG. 2.

Referring to FIGS. 2 and 3, the locking device 50 includes a frame 60, a pair of sliding members 70 arranged at opposite sides of the frame 60, and a pair of rotating members 80 respectively connected to the sliding members 70.

The frame 60 includes a mounting plate 62 and a pair of connecting members 64.

The mounting plate 62 is rectangular and thin. The mounting plate 62 is substantially the same size as the circuit board 30. A fixing hole 620 is defined in the mounting plate 62 corresponding to each of the through holes 32 of the circuit board 30, and a pilot hole 622 is defined in the mounting plate 62 corresponding to each bore 34 of the circuit board 30. When the circuit board 30 is stacked on the mounting plate 62, fixing devices, such as screws, extend through the bores 34 of the circuit board 30 and then engage in the pilot holes 622 of the mounting plate 62 to fix the circuit board 30 on the mounting plate 62 of the frame 60 of the locking device 50. Thus the circuit board 30 and the locking device 50 form a single unit and can be assembled/disassembled to/from the substrate 10 together.

The two connecting members 64 are arranged adjacent to two corners of the mounting plate 62 which are located on a diagonal of the mounting plate 62. Each connecting member 64 extends perpendicularly and downward from a shorter side of the mounting plate 62. A first U-shaped groove 640 is defined in each connecting member 64. A first positioning piece 642 is formed by the first U-shaped groove 640 and can rotate to be offset along the first U-shaped groove 640. A lobe 644 is protruded from a bottom of an inner side of the first positioning piece 642 of each connecting member 64 towards the other connecting member 64.

A plurality of pins 66 are formed on the mounting plate 62 and the connecting members 64 of the frame 60. In this embodiment, there are three pins 66 formed on each shorter side of the mounting plate 62, and two pins 66 on each connecting member 64. The three pins 66 on each short side of the mounting plate 62 are evenly distributed between the fixing holes 620. The two pins 66 on each connecting member 64 are located at opposite sides of the first U-shaped groove 640, respectively. Each pin 66 includes a main body 660 extending perpendicularly from the frame 60 and a hood 662 formed at a distal end of the main body 660. The hood 662 of the pin 66 is larger than the main body 660 in diameter.

The two sliding members 70 are slidably connected to the two connecting members 64 of the frame 60, respectively. Each sliding member 70 includes a flat plate 72 and a vertical plate 74.

The flat plate 72 is elongated. A length of the flat plate 72 is slightly shorter than the width of the mounting plate 62. A locking groove 720 is defined at a first end of the flat plate 72 adjacent to the connecting member 64. The locking groove 720 is semi-circular, and extends through the first end of the flat plate 72 in a longitudinal direction of the flat plate 72. A diameter of the locking groove 720 is smaller than that of the head 142 of the fixing pin 66 but larger than that of the neck 144 of the fixing pin 66.

A latching groove 722 is defined at a second end of the flat plate 72 opposite to the first end. The latching groove 722 includes a circular hole 724 and a slit 726 communicating with the circular hole 724. The circular hole 724 is closer to the locking groove 720 than the slit 726. A diameter of the circular hole 724 is larger than that of the head 142 of the fixing pole 14 but smaller than that of the post 140 of the fixing pole 14. A width of the slit 726 is smaller than the diameter of the head 142 but larger than the neck 144 of the fixing pole 14.

A sliding groove 79 is defined in the flat plate 72 of the sliding member 70 corresponding to each pin 66 at a corresponding shorter side of the mounting plate 62. The sliding grooves 79 of the flat plate 72 are evenly distributed between the locking groove 720 and the latching groove 722.

The vertical plate 74 extends perpendicularly downward from an outer edge of the first end of the flat plate 72. The vertical plate 74 includes a connecting portion 76 adjacent to the locking groove 720 and a fixing portion 78. The fixing portion 78 offsets outward relative to the connecting portion 76 a distance substantially equal to a thickness of the connecting member 64.

Each connecting portion 76 of the vertical plate 74 defines two sliding grooves 79 corresponding to the two pins 66 of the connecting member 64. The sliding grooves 79 of the connecting portion 76 of the vertical plate 74 and the flat plate 72 are identical in structure. Each sliding groove 79 includes a split 790 and an opening 792 communicating with the split 790. The split 790 is closer to the locking groove 720 relative to the opening 792, while the opening 792 is closer to the latching groove 722 relative to the split 790. A diameter of the opening 792 is slightly larger than that of the hood 662 of the pin 66, and a width of the split 790 is smaller than the diameter of the hood 662 of the pin 66 but not smaller than the diameter of the main body 660 of the pin 66. A length of the split 790 of the sliding groove 79 is larger than that of the slit 726 of the latching groove 722.

A first notch 760 and a second notch 762 are defined in the connecting portion 76 of the vertical plate 74. The first notch 760 and the second notch 762 each extend vertically, and both are located between the two sliding grooves 79 of the vertical plate 74. The first notch 760 and the second notch 762 are parallel to each other, while the first notch 760 is closer to the fixing portion 78 than the second notch 762. A distance between the first notch 760 and the second notch 762 is substantially the same as the length of the slit 726 of the latching groove 722, while shorter than the split 790 of the sliding groove 79.

A pivot 780 extends outward from the fixing portion 78 of the vertical plate 74 at a position adjacent to the connecting portion 76, and a receiving groove 782 is defined adjacent to an outer edge of the fixing portion 78. A riveting hole 784 is defined in the fixing portion 78 between the pivot 780 and the receiving groove 782. A second U-shaped groove 786 is defined in the fixing portion 78 between the riveting hole 784 and the pivot 780. A second positioning piece 788 is formed in the second U-shaped groove 786 with a nub 789 protruding outward therefrom.

The two rotating members 80 are respectively connected to the fixing portions 78 of the vertical plates 74 of the two sliding members 70. Each rotating member 80 includes a connecting board 82 and an operation portion 84 formed at a top side of the connecting board 82. A rotating knob 840 if formed at an end of the operation portion 84 adjacent to the first end of the flat plate 72, and a sliding knob 842 is formed at the other end of the operation portion 84.

A pivoting hole 820 is defined in the connecting board 82 of the rotating member 80 corresponding to the riveting hole 784 of the fixing portion 78 of the vertical plate 74. An arced groove 824 is defined in the connecting board 82 with a center at the pivoting hole 820. A diameter of an imaginary circle on which the arced groove 824 is located is approximately the same as a distance between the pivot 780 and the riveting hole 784 of the fixing portion 78. A canal 826 is defined in the connecting board 82 corresponding to the rod 18 on the substrate 10. The canal 826 is adjacent to the sliding knob 842. A recess 828 is defined in the connecting board 82 corresponding to the nub 789 of the fixing portion 78. The recess 828 is adjacent to the rotating knob 840.

When the rotating members 80 are assembled to the sliding members 70, the connecting board 82 of each rotating member 80 is arranged adjacent to the fixing portion 78 of the vertical plate 74 of the corresponding sliding plate. The pivoting hole 820 of the connecting board 82 faces the riveting hole 784 of the fixing portion 78, and the pivot 780 of the fixing portion 78 engages in the arced groove 824 of the connecting board 82. A rivet 90 extends through the pivoting hole 820 of the connecting board 82 of the rotating member 80 and then fixed in the riveting hole 784 of the fixing portion 78 of the vertical plate 74 of the corresponding sliding member 70 to assemble the rotating member 80 to the corresponding sliding member 70. Since the rotating members 80 are not fixed with the rivets 90, each rotating member 80 can rotate around the rivet 90 after the rotating member 80 is assembled to the sliding member 70.

Figure 7:
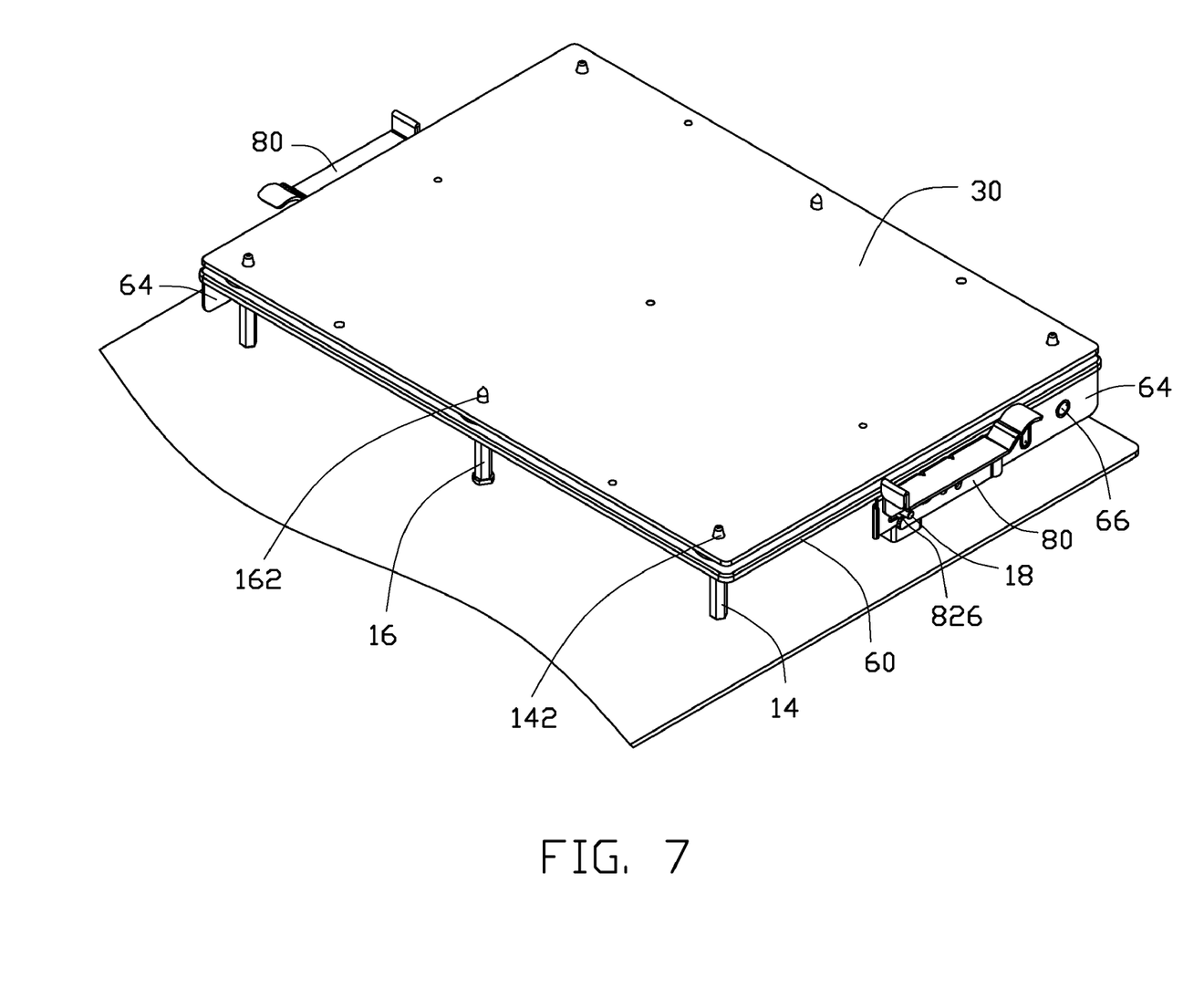
FIG. 7 shows the locking device on the substrate being self-locked.

During rotation of the rotating member 80, the pivot 780 engaged in the arced groove 824 limits a rotating angle of the rotating member 80. Referring to FIG. 7, when the rotating member 80 rotates to a position where the pivot 780 is located at a top of the arced groove 824, the nub 789 of the fixing portion 78 of the vertical plate 74 of the sliding member 70 engages in the recess 828 of the connecting board 82 of the rotating member 80 to avoid relative movement between the rotating member 80 and the sliding member 70. Thus the rotating member 80 is locked on the corresponding sliding member 70. In such a state, the operation portion 84 of the rotating member 80 is substantially horizontal, and the connecting board 82 of the rotating member 80 and the fixing portion 78 of the vertical plate 74 overlap each other.

When the sliding members 70 are assembled to the connecting members 64 of the frame 60, firstly, the connecting portion 76 of the vertical plate 74 of each sliding member 70 is arranged at an inner side of a corresponding connecting member 64, and overlaps with the connecting member 64. The fixing portion 78 of the vertical plate 74 is substantially coplanar with the connecting member 64. The pins 66 at the corresponding shorter side of the mounting plate 62 of the frame 60 face the openings 792 of the sliding grooves 79 of the flat plate 72, and the pins 66 of the corresponding connecting member 64 face the openings 792 of the sliding grooves 79 of the connecting portion 76. Then the sliding member 70 moves relative to the frame 60 to cause the hood 662 of each pin 66 to extend through the opening 792 of the corresponding sliding groove 79, and then the main body 660 of each pin 66 slides to the split 790 until the pins 66 encounter the flat plates 72.

Since the diameter of the hood 662 of the pin 66 is larger than the width of the split 790 of the sliding groove 79, the sliding members 70 are kept from falling from the frame 60 when the pins 66 are located at the splits 790 of the sliding grooves 79. Thus the sliding members 70 are assembled to the connecting members 64 of the frame 60. When the sliding members 70 are assembled to the frame 60, the lobe 644 of each connecting member 64 engages in the second notch 762 of the corresponding connecting portion 76 of the vertical plate 74 to limit relative movement between the sliding member 70 and the frame 60. Thus the sliding members 70 are locked on the frame 60.

After the sliding members 70 are assembled to the frame 60 and the rotating members 80, the locking device 50 forms a single integrated unit. It is to be understood that the sliding members 70 can be assembled to the frame 60 firstly, and then assembly the rotating members 80 to the sliding member 70, and alternatively, the rotating members 80 can be assembled to the sliding members 70 firstly, and then the sliding members 70 with the rotating members 80 fixed thereon are assembled to the sliding member 70 to form the locking device 50. In addition, it should be understood that the circuit board 30 can be fixed to the mounting plate 62 after the locking device 50 being assembled or before assembly of the locking device 50.

Figure 4:
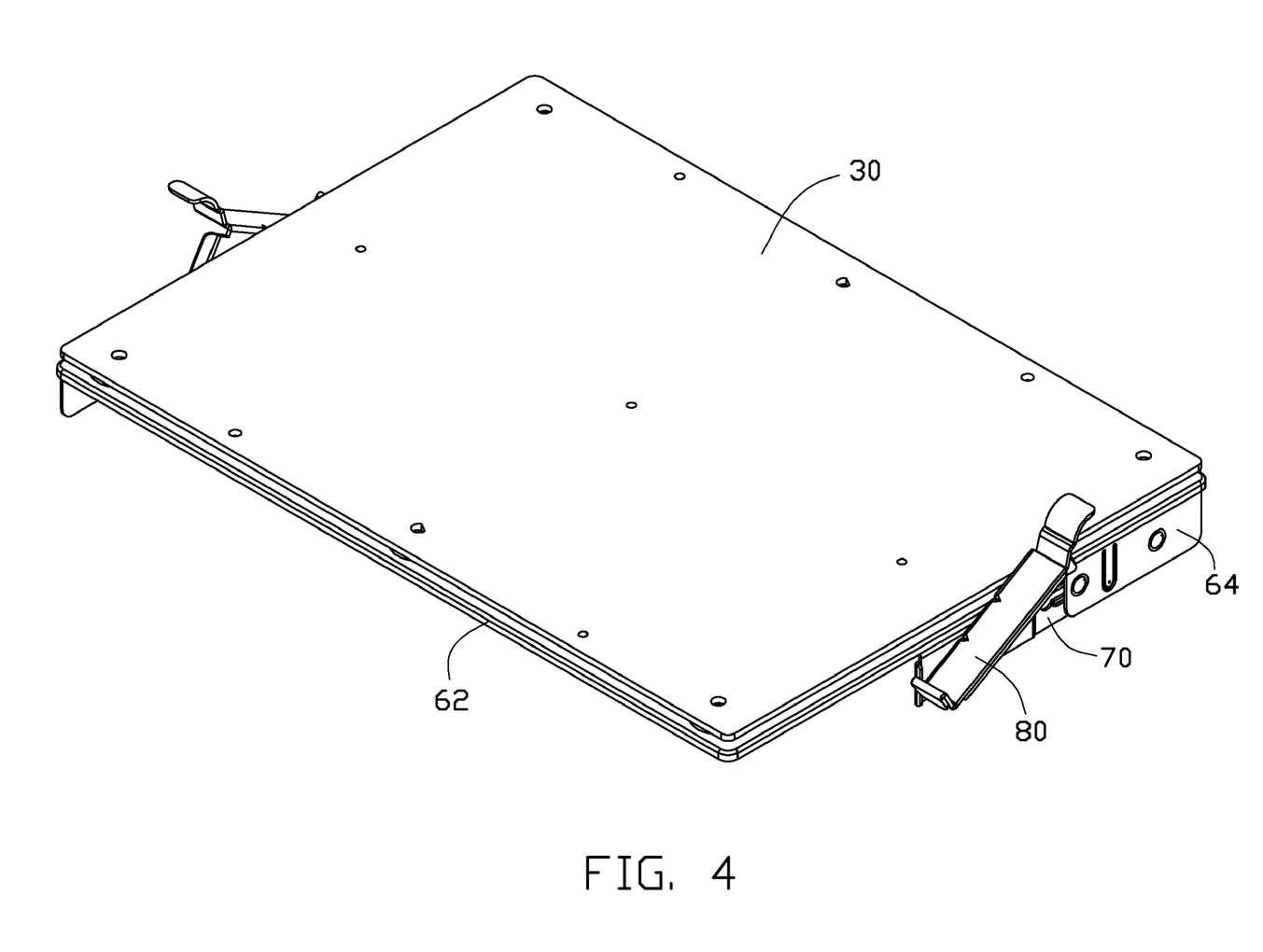
FIG. 4 is an assembled view of the locking device of FIG. 2.
Figure 5:
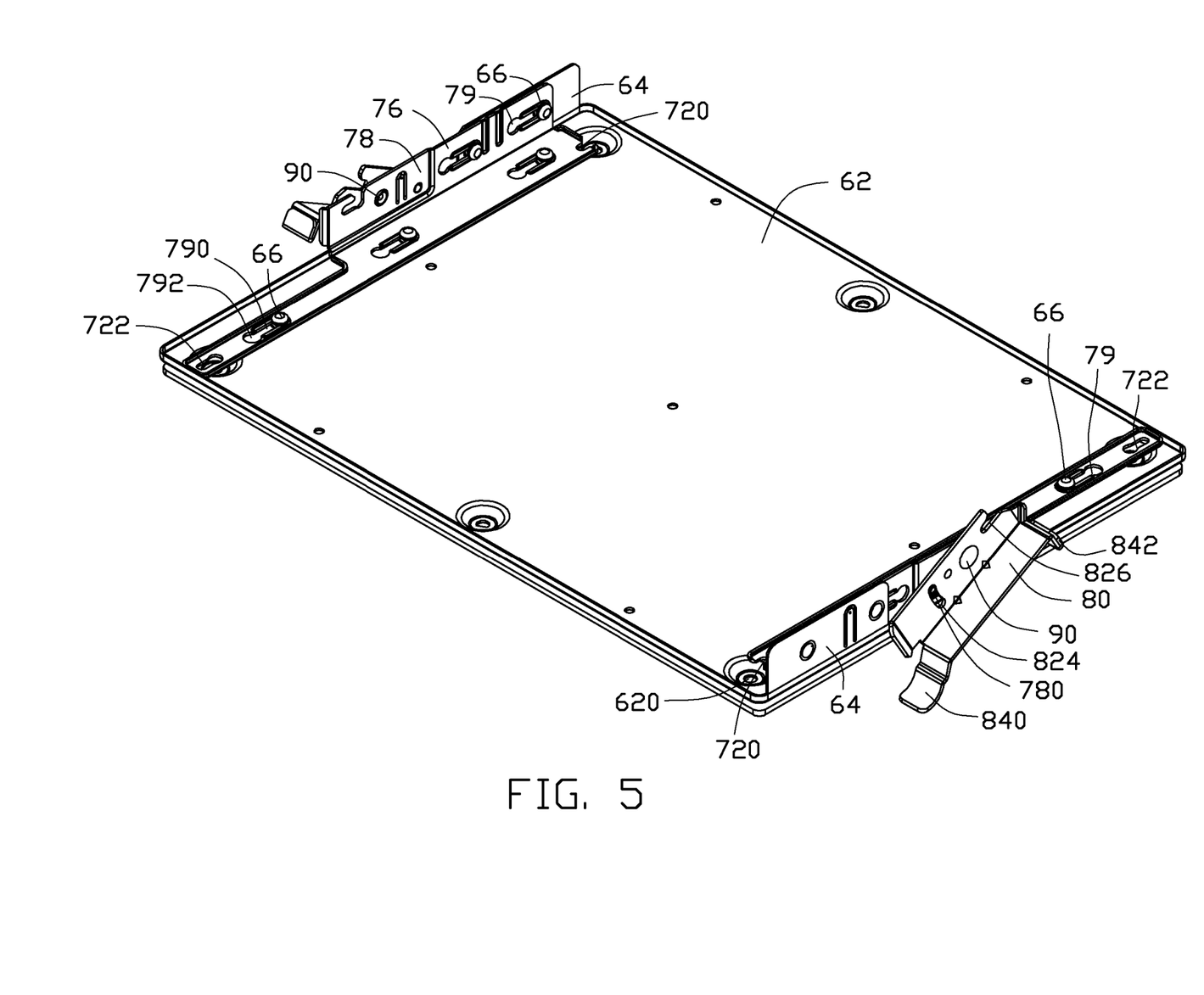
FIG. 5 is an inverted view of FIG. 4.

To assemble the circuit board 30 to the substrate 10 of the server via the locking device 50, firstly, referring to FIGS. 4 and 5, a force is applied to the rotating knob 840 of each rotating member 80 to cause the nub 789 to deviate from the recess 828, thus the rotating members 80 are unlocked with the sliding member 70 and can rotate relative to the sliding members 70. Then the rotating member 80 rotates to a position where the pivots 780 are at bottoms of the arced grooves 824. In such a state, the rotating members 80 are slantwise and thus the canals 826 are slantwise.

Figure 6:
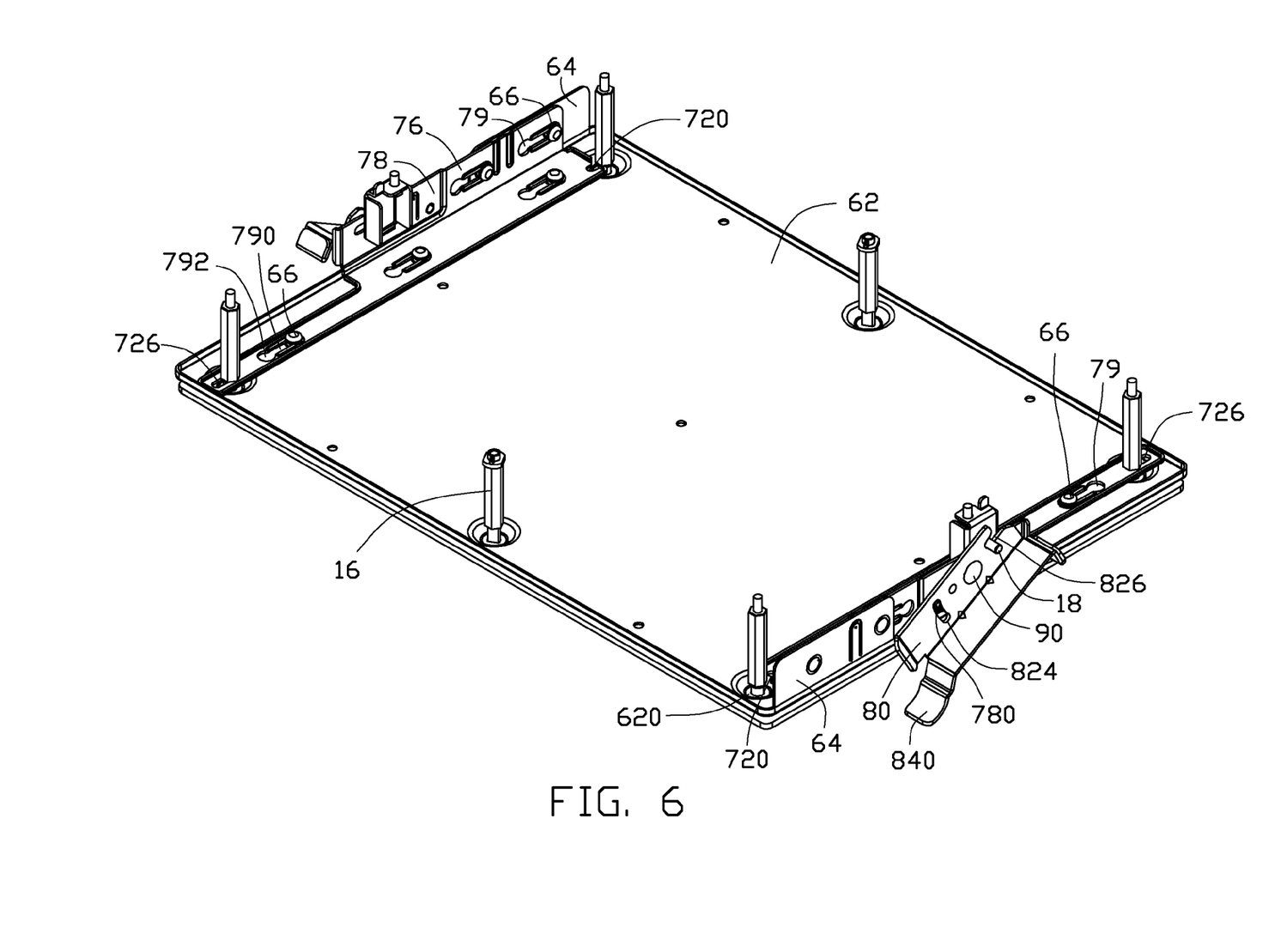
FIG. 6 shows the locking device being assembled to a substrate of the server, but not locked, a main board of the substrate being omitted for clearly showing the features.

Referring to FIG. 6, the locking device 50 is then mounted to the substrate 10 with the fixing poles 14 and the positioning poles 16 extending through the fixing holes 620 of the mounting plate 62 and the through holes 32 of the circuit board 30 in turn. The locking device 50 is supported by the supporting faces 146 of the fixing poles 14 since the fixing holes 620 of the frame 60 are smaller than the posts 140 of the fixing poles 14. Two of the fixing poles 14 adjacent to the connecting members 64 are located beyond the sliding members 70, and face the locking grooves 720 of the sliding members 70, respectively. A distance between each of the two fixing poles 14 and the corresponding locking groove 720 is substantially equal to the length of the slit 726 of the latching groove 722. The other two fixing poles 14 extend through the circular holes 724 of the latching grooves 722 of the sliding members 70, respectively. At the same time, the rods 18 engage into the slantwise canals 826 of the rotating members 80.

Figure 8:
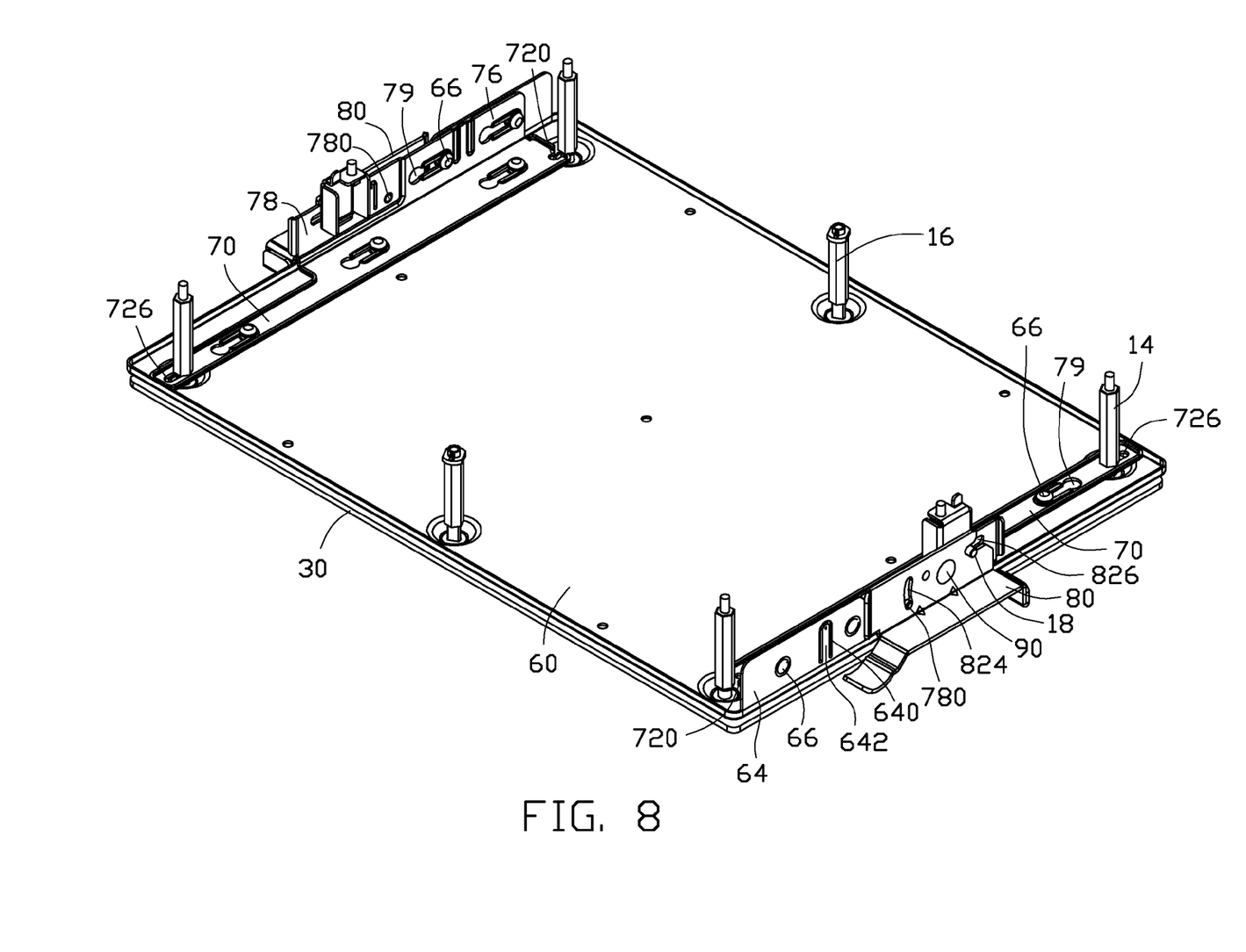
FIG. 8 is an inverted view of FIG. 7 with the main board being omitted.

Referring to FIGS. 7 and 8, the rotating knob 840 of each rotating member 80 is then rotated to lock the rotating member 80 to the sliding member 70. In such a state, the rotating member 80 is horizontal, the pivot 780 is at the top of the arced groove 824, and the nub 789 of the sliding member 70 is engaged in the recess 828 of the rotating member 80 to limit relative rotation between the sliding member 70 and the rotating member 80.

Figure 9:
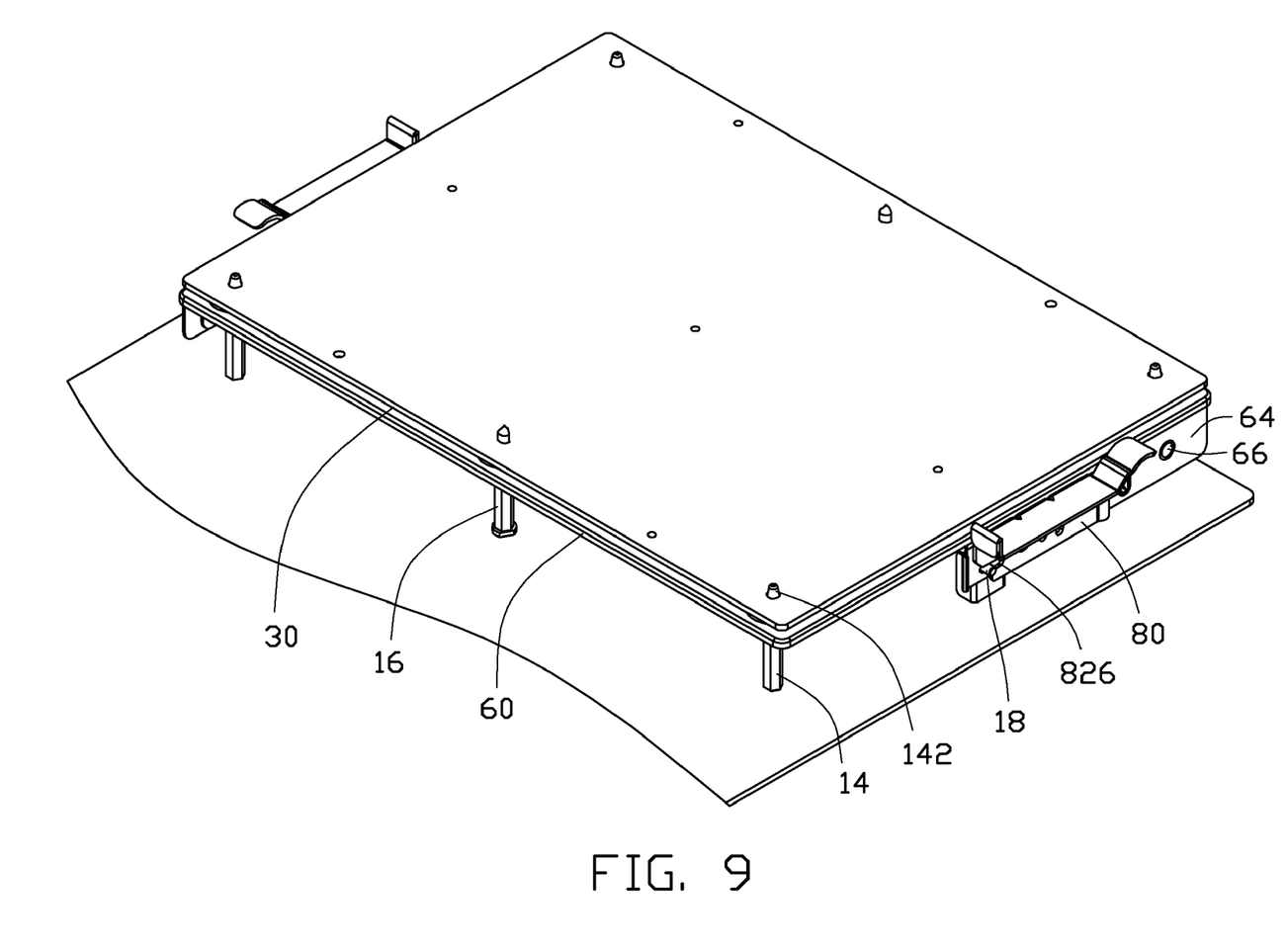
FIG. 9 shows the locking device locked to the substrate.
Figure 10:
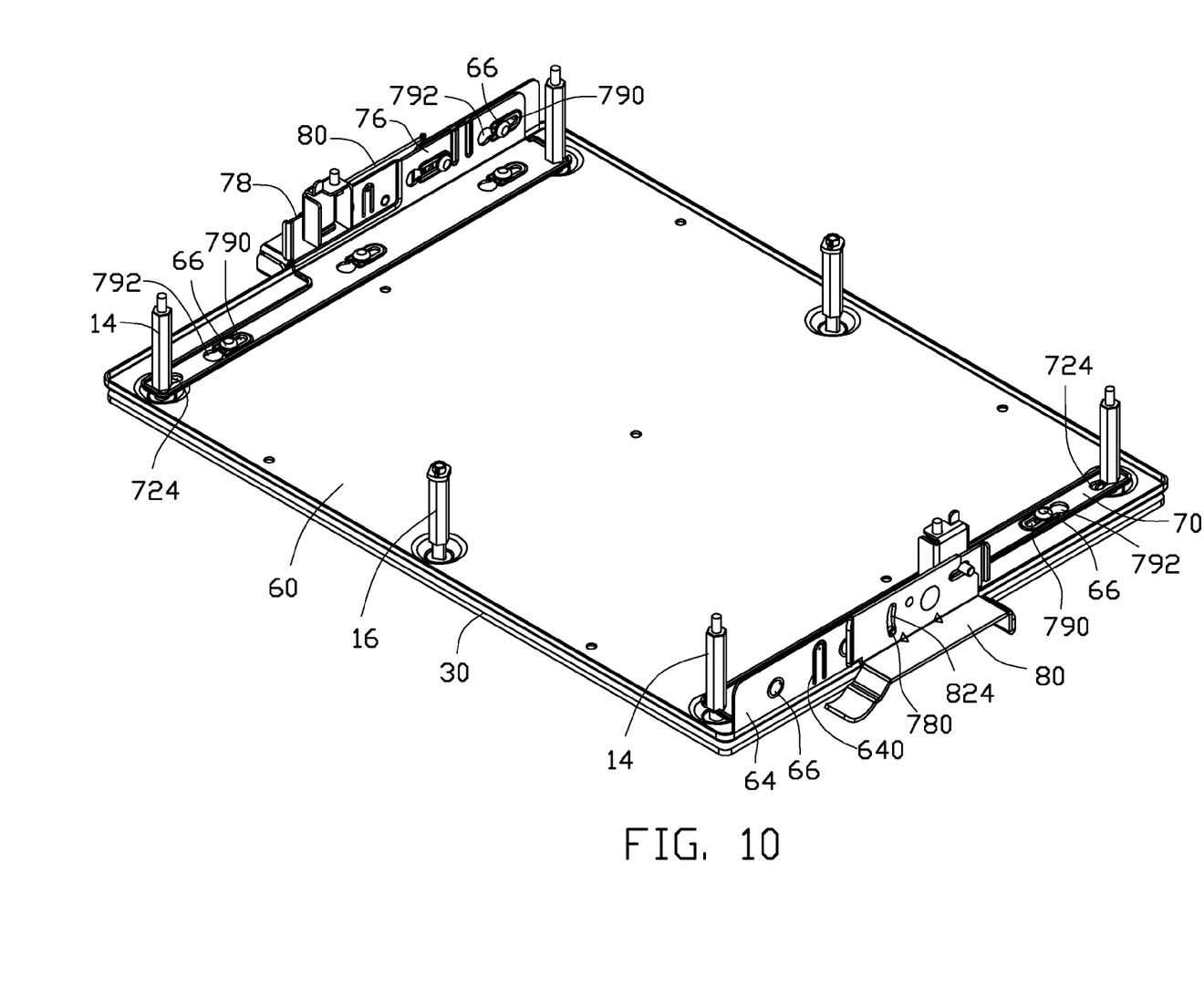
FIG. 10 is an inverted view of FIG. 9 with the main board being omitted.

Finally, referring to FIGS. 9 and 10, a pushing force is applied on the sliding knob 842 of each sliding member 70 to cause the lobe 644 of each connecting member 64 to escape from the second notch 762 of the connecting portion 76 of the vertical plate 74 of the corresponding sliding member 70.

Thus the sliding members 70 are unlocked, and can move relative to the frame 60 until the necks 144 of the two fixing poles 14 of the substrate 10 engage in the locking grooves 720 of the sliding members 70, respectively. At the same time, the necks 144 of the other two fixing poles 14 are moved to and engaged in the slits 726 of the latching grooves 722 of the sliding members 70, respectively. Since the head 142 of the fixing pole 14 is larger than the slit 726 of the latching groove 722 and the locking groove 720, the locking device 50 and the circuit board 30 fixed on the locking device 50 cannot escape from the fixing poles 14 along a longitudinal direction. Thus, the circuit board 30 is locked to the substrate 10 of the server by the locking device 50.

Since the distance between the first notch 760 and the second notch 762 is equal to the length of the slit 726 of the latching groove 722, the lobe 644 escaped from the second notch 762 engages in the first notch 760 of the sliding member 70 when the locking device 50 is locked to the fixing poles 14 of the substrate 10 to limit movement between the sliding members 70 and the frame 60 in a horizontal direction. Thus the locking device 50 and the circuit board 30 on the substrate 10 are stable. In addition, since the length of the slit 726 of the latching groove 722 is smaller than that of the split 790 of the sliding groove 79, the main body 660 of each pin 66 is engaged in a middle of the split 790 of the sliding groove 79 when the locking device 50 is locked to the fixing poles 14, and thus the sliding members 70 are kept from falling from the frame 60.

When the circuit board 30 needs to be disassembled, a force can be applied to the sliding member 70 to cause the lobes 644 of the connecting members 64 to escape from the first notches 760 of the sliding members 70, and thus the sliding members 70 can move relative to the frame 60 to cause the two fixing poles 14 to escape from the locking grooves 720. Then the rotating members 80 are rotated to cause the rods 18 to escape from the canals 826 of the rotating members 80. Thus the locking device 50 with the circuit board 30 can be taken away from the substrate 10. Therefore, both assembly and disassembly of the circuit board 30 via the locking device 50 is convenient.

It is to be understood, however, that even though numerous characteristics and advantages of embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A server, comprising:
   a substrate with a fixing pole extending outward thereof, the fixing pole comprising a post, a head and a neck between the post and the head, the neck narrower than the head and the post;
   a locking device comprising:
   a frame with a pin extending outward thereof, the pin comprising a main body and a hood wider than the main body; and a sliding member defining a latching groove and a sliding groove therein, the latch groove comprising a circular hole facing the sliding groove and a slit communicating with the circular hole, the circular hole being wider than the head of the fixing pole, the slit being narrower than the head of the fixing pole but not smaller than the neck of the fixing pole, the sliding groove comprising an opening facing the latch groove and a split communicating with the opening, the opening being wider than the hood of the pin, the split being narrower than the hood of the pin but not narrower than the main body of the pin, the hood of the pin extended through the opening of the sliding groove, the sliding member moving relative to the frame along a first direction to cause the main body of the pin to engage in the split of the sliding groove, the head of the fixing pin extending through the circular hole of the latching groove, the sliding member moving relative to the frame along a second direction opposite to the first direction to cause the neck of the fixing pole to engage in the slit of the latching groove; and a circuit board fixed on the flame of the locking device; wherein the sliding member further defines a locking groove therein, the latching groove and the locking groove are respectively formed at opposite ends of the sliding member, the sliding groove is located between the latching groove and the locking groove, the locking groove is narrower than the head of the fixing pole but not narrower than the neck of the fixing pole, and the substrate has another fixing pole with the neck thereof engaged in the locking groove when the neck of the fixing pole is engaged in the slit of the latching groove.

2. The server of claim 1, wherein the split of the sliding groove is longer than the slit of the latching groove, and the pin is located at a middle of the split of the sliding groove when the neck of the fixing pole is engaged in the slit of the latching groove.

3. The server of claim 1, wherein the sliding member comprises a flat plate and a vertical plate perpendicular to the flat plate, the latching groove and the locking groove are respectively formed at opposite ends of the flat plate, and a rotating member is connected to the vertical plate and has a sliding knob for push the rotating member and the sliding member together to move relative to the frame.

4. The server of claim 3, wherein the frame comprises a mounting plate and a connecting member extending perpendicularly from a lateral edge of the mounting plate, the flat plate of the sliding member is connected to the mounting plate, the vertical plate is connected to the connecting member, one of the vertical plate and the connecting member defines two notches, and the other one of the vertical plate and the connecting member forms a lobe which is engaged in one of the two notches when the neck of the fixing pole is engaged in the slit of the latching groove, and is engaged in the other one of the two notches when the main body of the pin is engaged in the split of the sliding groove.

5. The server of claim 3, wherein the rotating member comprises a connecting board and an operation portion, the connecting board is rotatably connected to the vertical board of the sliding member, a rotating knob is formed at an end of the operation portion, and the sliding knob is formed at the other end of the operation portion.

6. The server of claim 5, wherein a pivot extends outward from the vertical plate of the sliding member, an arced groove is defined in the connecting board of the rotating member, and the pivot is received in the arced groove and can rotate along the arced groove.

7. The server of claim 6, wherein a canal is defined in the rotating member, a rod is formed on the substrate, the canal slants to cause the rod to slide into the canal when the pivot is at an end of the arced groove, and the canal is horizontal to keep the rod in the canal when the pivot is at the other end of the arced groove.

8. The server of claim 6, wherein one of the sliding member and the rotating member defines a recess, the other one of the sliding member and the rotating member forms a nub, and the nub is received in the recess when the pivot is at an end of the arced groove.

9. A locking device, comprising:
a frame with a pin extending outward thereof, the pin comprising a main body and a hood wider than the main body; and a sliding member defining a latching groove and a sliding groove therein, the latch groove comprising a circular hole facing the sliding groove and a slit communicating with the circular hole, the circular hole being wider than the slit, the sliding groove comprising an opening facing the latch groove and a split communicating with the opening, the opening being wider than the hood of the pin, the split being narrower than the hood of the pin but not narrower than the main body of the pin, the hood of the pin extended through the opening of the sliding groove, the sliding member moving relative to the frame along a first direction to cause the main body of the pin to engage in the split of the sliding groove; wherein the sliding member further defines a locking groove therein, the latching groove and the locking groove are respectively formed at opposite ends of the sliding member, the sliding member is located between the latching groove and the locking groove, and a width of the locking groove is substantially the same as that of the slit of the latching groove; wherein the split of the sliding groove is longer than the slit of the latching groove; wherein the sliding member comprises a flat plate and a vertical plate perpendicular to the flat plate, the latching groove and the locking groove are respectively formed at opposite ends of the flat plate, and a rotating member is connected to the vertical plate and has a sliding knob for push the rotating member and the sliding member together to move relative to the frame.

10. The locking device of claim 9, wherein the frame comprises a mounting plate and a connecting member extending perpendicularly from a lateral edge of the mounting plate, the flat plate of the sliding member is connected to the mounting plate, the vertical plate is connected to the connecting member, one of the vertical plate and the connecting member defines two notches, and the other one of the vertical plate and the connecting member forms a lobe which is engaged in one of the two notches when the main body of the pin is engaged in the split of the sliding groove, and is engaged in the other one of the two notches when the sliding member moves relative to the frame along a second direction opposite to the first direction.

11. The locking device of claim 9, wherein the rotating member comprises a connecting board and an operation portion, the connecting board is rotatably connected to the vertical board of the sliding member, a rotating knob is formed at an end of the operation portion, and the sliding knob is formed at the other end of the operation portion.

12. The locking device of claim 11, wherein a pivoting hole is defined in the connecting board of the rotating member, a riveting hole is defined in the vertical plate of the sliding member, and a rivet extends through the pivoting hole and fixed in the riveting hole to connect the rotating member with the sliding member.

13. The locking device of claim 11, wherein a pivot extends outward from the vertical plate of the sliding member, an arced groove is defined in the connecting board of the rotating member, and the pivot is received in the arced groove and can rotate along the arced groove.

14. The locking device of claim 13, wherein one of the sliding member and the rotating member defines a recess, the other one of the sliding member and the rotating member forms a nub, and the nub is received in the recess when the pivot is at an end of the arced groove.

* * * * *